United States Patent [19]

Weirauch

[11] 4,296,347
[45] Oct. 20, 1981

[54] SURFACE ACOUSTIC WAVE SENSOR
[75] Inventor: Donald F. Weirauch, Dallas, Tex.
[73] Assignee: Texas Instruments Incorporated, Dallas, Tex.
[21] Appl. No.: 79,735
[22] Filed: Sep. 28, 1979
[51] Int. Cl.³ .................. H01L 41/02; H03H 9/05
[52] U.S. Cl. .................. 310/313 B; 73/765; 310/313 R; 310/344
[58] Field of Search ........... 73/765, 778, 774, DIG. 4; 310/313 R, 313 B, 344

[56] References Cited
U.S. PATENT DOCUMENTS

| | | | |
|---|---|---|---|
| 3,274,828 | 9/1966 | Pulvari | 73/DIG. 4 |
| 3,427,876 | 2/1969 | Steele et al. | 73/778 X |
| 3,888,115 | 6/1975 | Schwartz | 73/765 |
| 4,096,740 | 6/1978 | Sallee | 73/DIG. 4 X |
| 4,100,811 | 7/1978 | Cullen et al. | 73/DIG. 4 X |
| 4,216,401 | 8/1980 | Wagner | 310/313 R |

OTHER PUBLICATIONS

Publication "A Small Sized Mechanical-Acoustic Pressure-Frequency Transducer" by P. V. Novitskii et al., Instrument and Control, 5/1971.

Primary Examiner—Daniel M. Yasich
Attorney, Agent, or Firm—Richard L. Donaldson; Gary C. Honeycutt; Melvin Sharp

[57] ABSTRACT

An improved surface acoustic wave sensor in which two surface acoustic wave arrays are disposed in predetermined overlapping relationship by the use of a sealing compound which both establishes a thin sealed cavity and spaces the two surface acoustic wave arrays apart a predetermined distance, thereby eliminating the need for spacing rings or the like.

10 Claims, 6 Drawing Figures

SURFACE ACOUSTIC WAVE SENSOR

This invention relates to surface acoustic wave sensors and more particularly to such sensors in which one or more of the resonant frequencies of the surface acoustic waves varies in accordance with the parameter to be sensed.

Surface acoustic wave sensors have been proposed, illustrative of which are those described in U.S. Pat. No. 3,888,115 granted to Robert J. Schwartz on June 10, 1975 and those described in Report No. R78-922631-3 of the Naval Air Systems Command entitled "Experimental Development of Digital Output Pressure and Temperature Sensors Using Surface Acoustic Waves".

While the foregoing sensors have represented improvements over previous proposals, there have nevertheless been continuing needs for surface acoustic wave sensors of simpler and less costly construction as well as the need to provide a construction more resistant to adverse characteristics of the environment in which the sensor is to be employed.

Accordingly, it is one general object of this invention to improve surface acoustic wave sensors.

It is another object of this invention to achieve a simplified construction.

It is another object of this invention to reduce manufacturing costs.

It is still another object of this invention to lessen vulnerability to harsh environments.

Accordingly, in accordance with one feature of the invention, a generally rigid member and a generally flexible member are both constructed of the same material and are both sealed together and spaced in a desired configuration by the utilization of a particularly efficacious sealant, e.g., glass frit.

In accordance with another feature of the invention, the first sensor element is disposed upon a surface of the generally rigid member and another is disposed on a surface of the generally flexible member in an overlapping relationship, the geometry being advantageously employed to create a relatively compact sealed chamber enclosing at least one of the sensor elements.

In accordance with still another feature of the invention, through the advantageous employment of the glass frit in conjunction with the associated generally rigid member and the generally flexible member when made of quartz material, an easily constructed and inexpensive structure is produced.

In accordance with still another feature of the invention, the surface acoustic wave elements are disposed on the inner surfaces of the generally rigid and generally flexible members and are enclosed hermetically within a resulting cavity, thereby rendering them impervious to hostile environments.

In accordance with yet another feature of the invention, in an alternative embodiment the generally rigid member may be made flexible, thereby providing a second member with variable resonant frequency and resulting in a potentially more sensitive sensor.

These and other objects and features of the invention will become apparent from the following detailed description, by way of example, with reference to the drawing in which.

Figure 1:
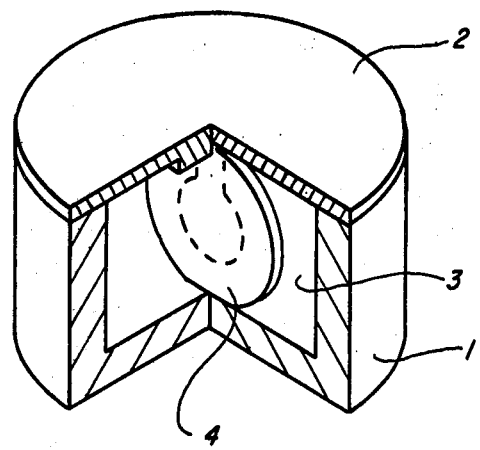
FIG. 1 is a view illustrative of the prior art.

Now turning more particularly to the drawing, the prior art is represented by FIG. 1 which is an illustration similar to that disclosed and described in a paper entitled "A Low-Range Quartz Resonator Pressure Transducer" by E. Karrer and R. Ward and published in the ISA Transactions, Volume 16, No. 2 (1977).

From reference to FIG. 1, it will be observed that it includes a relatively solid body member 1 which together with a relatively thin diaphragm member 2 forms a cavity 3 in which a resonator 4 is located. According to the accompanying description, the relatively thin diaphragm 2 (of quartz material) is sealed to the relatively solid body 1 (also of quartz material) by the use of a divitrifying (crystallizing) type glass.

In operation, a force proportional to applied pressure is applied to the resonator array 4 via the flat circular quartz diaphragm 2. The resulting resonating array frequency change is a function of the applied pressure.

Other prior art embodiments include a pair of surface acoustic wave elements disposed in butt-ended or side by side configuration. (For example, the elements disclosed in the above-identified patent to Schwartz). These typically employ one of the two as a reference and the other as a variable which is dependent upon the quantity to be measured.

Figure 2:
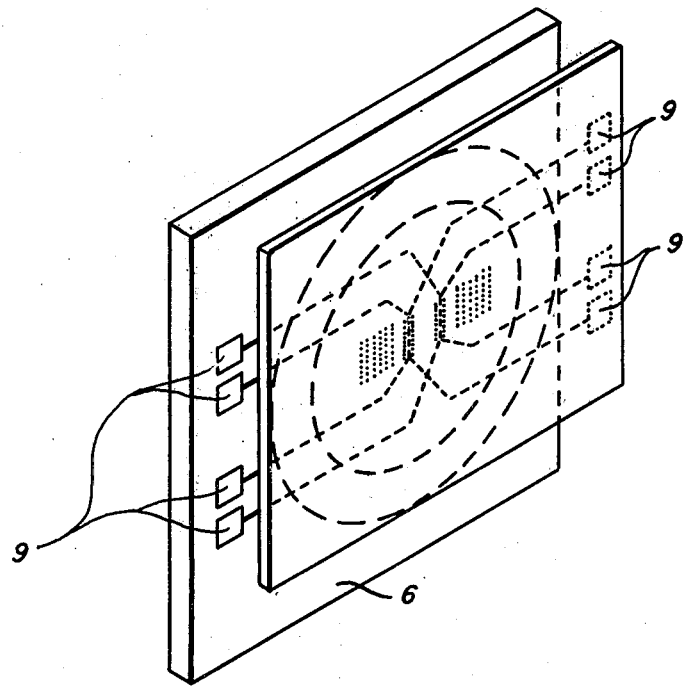
FIG. 2 is a top perspective view of a sensor in accordance with the present invention.
Figure 3:
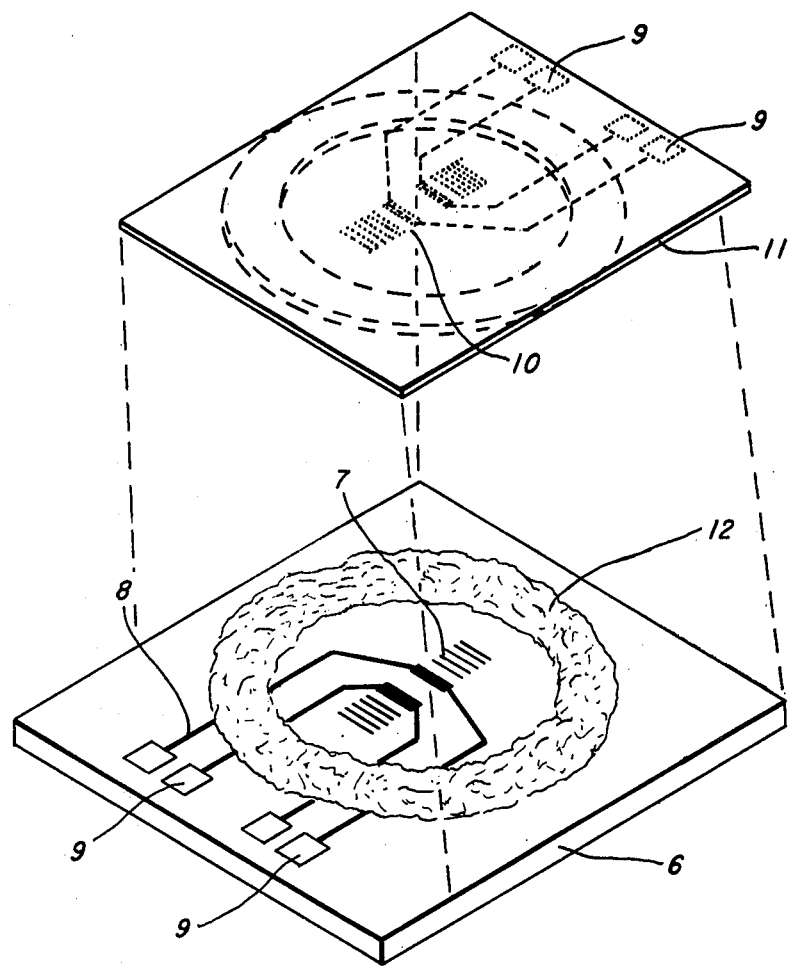
FIG. 3 is an exploded view of the sensor of FIG. 2.

Now turning to FIGS. 2 and 3, in which like parts are identified with like symbols, reference is made to an embodiment in accordance with the present invention.

In FIGS. 2 and 3, it will be observed that the sensor hereof is improved with respect to prior art such as that depicted in FIG. 1. In FIGS. 2 and 3, there are shown a relatively inflexible base member 6 supporting a surface acoustic wave resonator 7 and electrical leads 8 which are brought out to contacts 9 that may either be disposed advantageously along the edge of the support (as shown) or terminated in any other convenient location.

Another surface acoustic wave configuration 10 is supported by a relatively thin (and consequently somewhat flexible) member 11. Wafer 11 is basically similar to support 6 except for being much thinner and therefore relatively resilient. Inasmuch as the array 10 supported by wafer 11 is preferably disposed on the underside thereof (where it will be both within a sealed cavity hereinafter described as formed by frit ring 12) it is shown dotted in the drawing.

As mentioned previously, in accordance with the teachings of the prior art, the use of a devitrifying (crystallizing) type glass for sealing a quartz package has heretofore been known. However, such packages have either been of a type such as that depicted in the prior art example of FIG. 1 wherein the internal cavity is formed by side walls; or spacers such as, for example, cylindrical segments, have been employed to provide the necessary cavity volume.

In contrast with the prior art, by an appropriate selection of sealing material, e.g., glass frit, and firing at appropriate temperatures, the material itself will occupy a sufficient volume to provide a spacing of from 2 to 3 mils between the main members (e.g., base member 6 and thin wafer 11) while at the same time providing the required seal therebetween. This, of course, markedly simplifies manufacture and reduces cost, thereby rendering the completed package much more economical and attractive.

The foregoing may be accomplished by starting with a reference wafer 6 having a thickness of approximately 0.01 to 0.02 inches or more and fabricated from conventional quartz material. The surface acoustic wave array may then be patterned onto the wafer by conventional techniques employing photomasking and vapor disposition. Thereafter, or coincident therewith, sensor wafer 11 may be prepared by correspondingly applying a surface acoustic wave array onto thin quartz wafer 11 which may be approximately 0.01 inch in thickness.

Although the thicknesses herein been found to be attractive for one construction, it will evident that others may be preferable for specific applications. For example, a greater ratio of thicknesses between the reference member 6 and the sensor wafer 11 may result in an improved frequency versus pressure characteristic. On the other hand, if both members are made relatively flexible by reducing the ratio of thickness to as little as 1, the sensitivity may be increased.

Next, a thin line (or perimeter) of glass frit 12 is disposed upon the upper surface of wafer 6 so as to almost completely surround the elements of array 7 as, for example, by screen printing techniques. However, a small section is left without frit so that when fired, a small aperture will exist through the ring. Similarly, and depending upon the consistency of the frit paste utilized, a mating line (or perimeter) may be disposed upon the corresponding surface of wafer 11 so that the two (or perimeters) will engage and coalesce when brought into aligned engagement. Thereafter, wafer 11 is positioned over wafer 6 in aligned configuration, as depicted in FIG. 2, and the assembly is heated to a temperature of approximately 365° celsius) for about 30 to 60 minutes. Thereafter, the assembly is cooled gradually to room temperature inambient air.

At this point, the structure will be basically assembled. However, further processing will occur, depending upon which of a plurality of alternatives is desired.

Alternative One: A small quantity of frit (or other suitable material, e.g., metallic alloys) is positioned over the aforementioned aperture. The assembly is placed in a vacuum chamber which is then evacuated to create a vacuum within the cavity. The assembly is then heated to about 365° for about 15 minutes to glassify the frit and thereby seal the aperture. If desired, after heating and glassification of the additional material, the vacuum may be reduced slightly to develop a slightly positive pressure on the material to assist it in flowing into the aperture. In addition, if desired, a small quantity of helium may be introduced into the vacuum chamber before the member is heated (and consequently before the sealing material has become viscous) so as to introduce a small quantity of helium into the chamber permanently.

Alternative Two: A small tube (or conduit) is aligned with and sealed to the aperture through the perimeter or ring. Preferably, the tube (or conduit) is made of glass or other material having a suitable coefficient of thermal expansion while at the same time exhibiting qualities of strength and sealability. The tube (or conduit) may be sealed to the aperture either by frit or other substances known to those skilled in the art. If frit is used, heating to a temperature of 365° C. for about 15 minutes should result in effective sealing of the tube to the structure.

EXAMPLE

Starting materials are ST quartz crystal material wafers each measuring approximately two inches by two inches square and one being about twenty mils thick and the other about ten mils thick.

For ease of processing, four surface acoustic wave arrays were fabricated on each of these two wafers, one in each of the four quadrants thereof.

After initial inspection to insure suitability of the material, each wafer was subjected to a standard optical polish to eliminate surface imperfections, using ceric oxide and syton. At the conclusion of the polish step, the wafers were carefully examined to insure that polishing had proceeded to a point where visible surface imperfections had been eliminated, thus producing a smooth and essentially planar surface.

Next, the wafers were soaked for about one hour at ambient temperature in a solution consisting of three parts of sulfuric acid and one part of hydrogen peroxide. This removed any slag and polish compounds remaining on the surfaces. Thereafter, the wafers were rinsed in clean water and their surfaces were swabbed with a solution of methyl alcohol and water before air drying.

After an additional visual inspection, the surface acoustic wave arrays were formed on the wafers. This was accomplished in a series of steps as follows:

First, a thin layer of aluminum approximating 1200 A° plus or minus 100 A° in thickness was deposited over the entire surface using known techniques. The surface was then covered with conventional photoresist which was exposed and developed to define the desired pattern for the transducer and resonator fingers of the surface acoustic wave array. After development and removal of the unwanted photoresist, the exposed aluminum was etched using a conventional aluminum leach comprised of phosphoric and nitric acids. The wafer remained in the aluminum leach solution until, by visual inspection, it was determined that the aluminum had cleared from the selected surface areas. Thereafter, the wafer was removed from the leach solution, rinsed and the photoresist was removed using conventional resist-removing solvents.

Next, photoresist was again applied over the entire surface and was then exposed and developed so as to leave a photoresist film only over the surface acoustic wave array transducers so as to protect them during subsequent etching. Photoresist was removed from the remainder of the surface and the wafer was placed in a conventional plasma etch chamber containing carbon tetrachloride and argon. Upon application of RF potential, etching proceeded and was permitted to continue until the quartz between the resonator fingers was etched to a depth of about 2100 A° plus or minus 100 A°, the aluminum on the fingers of the resonators acting as masks to prevent etching except where the quartz was exposed therebetween.

Next, the aluminum of the resonator fingers was removed by immersing the wafer in the aluminum leach solution, the photoresist remaining in place over the transducer sections to protect them during this procedure. After the aluminum had been removed, the wafer was removed from the leach solution, rinsed and the photoresist was removed from the surface areas overlying the transducers.

After inspection, photoresist was again applied to the entire substrate surface, exposed and a pattern opened therein for deposition of material to effect electrical connections to the transducers. A thin layer of aluminum was then vapor deposited on the exposed surfaces until it had grown to a thickness of approximately 4,000 A° plus or minus 100 A°. Thereafter, the remaining photoresist (and the unwanted aluminum overlying that photoresist) were removed by immersion in conventional photoresist solvent, i.e., acetone, thus leaving aluminum strips and pads for electrical connections affixed to the wafer surface.

After inspection, the wafers were then sawed into their respective quadrants in order for each to yield four similar surface acoustic wave arrays. After conventional cleanup to remove any unwanted residuals remaining after the sawing, the individualized wafers were then inspected and prepared for further processing.

Although the specific example herein involved the steps as described, it will be evident to those skilled in the art that two or more steps could be combined. Thus, the basic elements of the array as well as the electrical connections could be laid down simultaneously.

After the wafers had been sawed and cleaned it was found that instead of measuring one inch by one inch, they measured about 0.8 inches by 0.8 inches. One of the relatively thick wafers and one of the relatively thin wafers were then chosen from which to complete the processing. The relatively thick wafer upon measurement was found to measure 23.2 mils in thickness and the other was found to measure 9.7 mils in thickness. These were then fabricated into the finished sensor in accordance with the following steps.

First, a quantity of glass frit (Owens-Illinois Company CV 432) was mixed into a paste using butyl carbitol as a vehicle. The paste was then applied by conventional screen printing techniques to both surfaces that were to be joined together. The two substrates on which the paste had been applied in configurations that later would match up when the surfaces were brought into near proximity were then heated to a temperature of about 160° C. on a hot plate and were maintained at that temperature for about fifteen minutes to volatilize and drive off the butyl carbitol.

Next, the two surfaces were brought into near engagement with the frit paste outlines being aligned so as to be coextensive. The lowermost member was disposed on a 0.37 inch thick brass block with the frit side up and the corresponding frit outline on the upper member brought into engagement therewith. Thereafter, a 123 gram brass block was laid on top of the upper member to provide some weight so as to maintain the two frit outlines in engagement when heating.

The members were then inserted (while retained in that relationship) into a furnace where they were heated to 365° C. for about thirty minutes. They were then removed and permitted to cool, the weight was removed and they were then examined. It was discovered that insufficient recrystallization had occurred and consequently they were reintroduced into the furnace and heated to 365° C. for an additional thirty minutes to complete recrystallization.

Upon examination, it was observed that a small aperture existed through what then was one coalesced ring which provided a spacing of two to three mils between the wafers and essentially completely formed a cavity. However, in order to completely seal the cavity, it was necessary to plug it shut. This was accomplished by applying a degassed frit particle to the passage opening; then, inserting the assembly into a vacuum chamber and evacuating it to 0.55 Torr. While in the vacuum chamber, the chamber was heated to an indicated temperature of 500° C. which, because of the geometries of the chamber was believed to have corresponded to a work piece temperature of about 365° C. where it was held for about ten minutes. Upon cooling, the sensor was examined and found to have had the opening completely sealed.

After this was accomplished, the assembly was found to have been sealed together by the frit which not only secured the two wafers together with the aforementioned clearance of approximately 2 to 3 mils, but in addition formed an hermetically sealed enclosure within the ring which provided protection for the two surface acoustic wave arrays.

Figure 4:
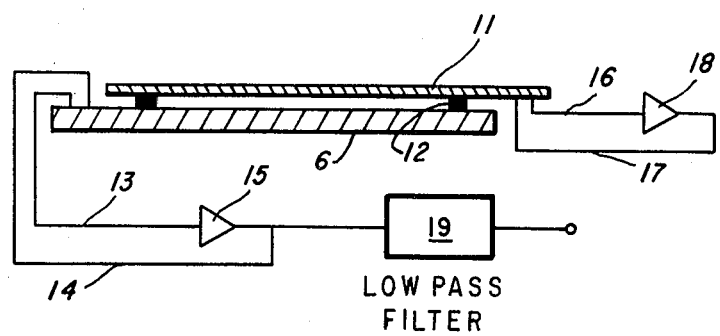
FIG. 4 is a view depicting in block diagram form the oscillators and other circuitry associated with the sensor of FIGS. 2 and 3.

The completed sensor was then connected to a pair of oscillating amplifiers and as depicted in FIG. 4, were found to undergo oscillation in the intended manner. These oscillators were constructed according to the diagram of FIG. 5 which, as one skilled in the art will observe, are representative of suitable circuits.

Further reference to FIG. 4 reveals that the electrical connections to which reference is made above, are made individually with oscillating amplifier 15 being connected via leads 13 and 14 to lower member 6; and oscillating amplifier 18 being connected via leads 16 and 17 to upper member 11.

Figure 5:
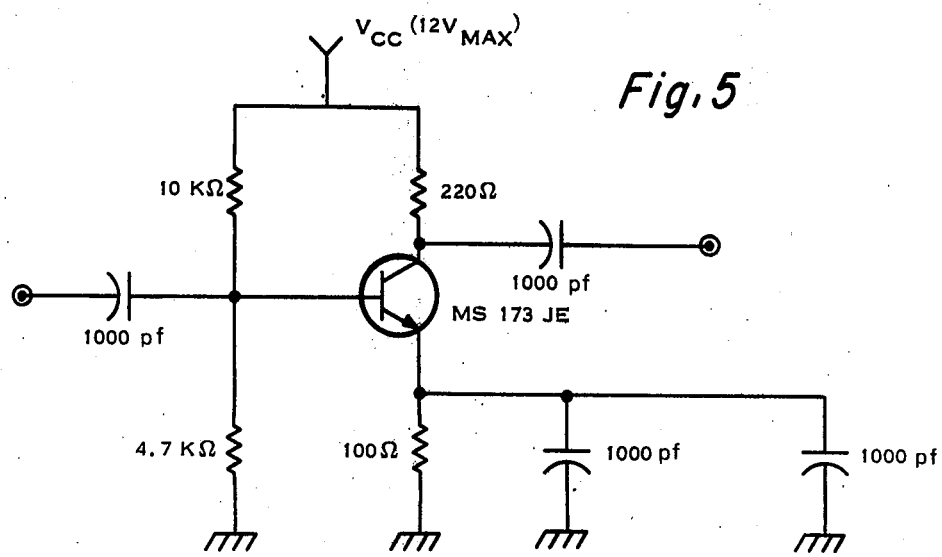
FIG. 5 is an electrical schematic diagram depicting oscillators suitable for employment with the aforementioned sensor.
Figure 6:
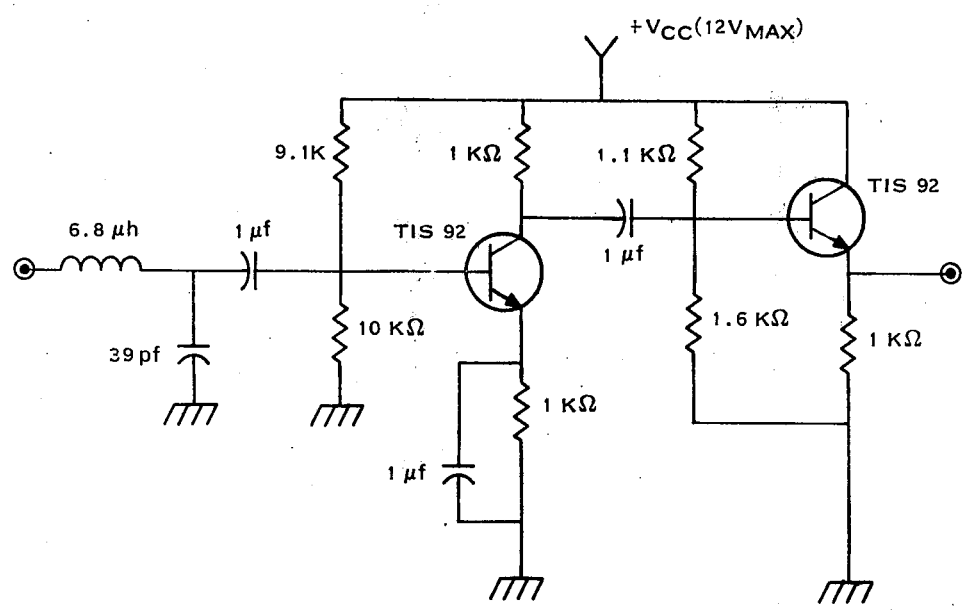
FIG. 6 is an electrical schematic diagram depicting a low-pass filter suitable for employment with the aforementioned sensor.

Now turning to FIGS. 5 and 6, it will be observed that they are, respectively, schematic electrical diagrams of oscillating amplifiers and a filter circuit which was employed in practicing the invention hereof.

FIG. 5 depicts a single transistor oscillator and attendant circuitry in detail, with representative values given for the associated resistors, capacitors and voltage source. While it will be evident to one skilled in the art that other parameters may be employed, those depicted were found to operate successfully with a typical transistor. Type MS 173 JE transistor which is manufactured by Texas Instruments Incorporated and is generally available for commercial sale, was used in an operating circuit.

FIG. 6 correspondingly illustrates a detailed schematic diagram for a filter which was employed in practicing the invention. As with the circuits of FIG. 5, those of FIG. 6 also include specific values of circuit parameters which were found to operate with a typical transistor. Type TIS 92 which is manufactured by Texas Instruments Incorporated and which is generally available for sale, was used in an operating circuit.

It will be observed from the foregoing that among the inventive features hereof is the utilization of a single bonding agent both to seal the two main supporting wafers together while maintaining a relatively thin space therebetween; and at the same time forming the walls of a thin chamber in which at least one of the surface acoustic wave arrays is disposed, thus eliminating the need for a separate or composite spacer and contributing to a greatly simplified structure.

The finished article is depicted in FIG. 2 wherein it is seen that the two wafers are slightly offset so as to advantageously expose the external contacts for electrical connection. However, as mentioned above, any other suitable arrangement for making electrical contacts could be employed as, for example, extending the leads over the edge of the wafers and making edge connections as is heretofore known in the art.

Although the aforementioned example illustrates the invention as involving quartz wafers and glass frit bonding agents, it will be evident to those skilled in the art that other materials could readily be employed without departing from the scope and spirit of the invention.

The words and expressions employed are intended as words of description and not of limitation, and there is no intention in the use thereof of excluding any equivalents, but on the contrary, it is intended to include any and all equivalents, adaptations and modifications that may be employed without departing from the spirit and scope of the invention.

What is claimed is:

1. A surface acoustic wave sensor comprising a first member having a first relatively flat surface, a second member having a second relatively flat surface, a first surface acoustic wave array positioned upon said first surface, a second surface acoustic wave array positioned upon said second surface, first electrical connection means for making electrical connections to said first array, second electrical connection means for making electrical connections to said second array, said first surface acoustic wave array and said second surface acoustic wave array disposed in proximity one to the other so as to create a capacitive coupling effect between said arrays, and a fired glass frit bonding agent solely disposed between said first and second surfaces to form an enclosed chamber between said first and said second members while rigidly affixing said first and said second members each to the other, said chamber enclosing at least one of said first and said second arrays.

2. A sensor according to claim 1 in which said frit is disposed in annular configuration, and one of said first and second members is composed of relatively thin and resilient quartz.

3. A sensor according to claim 1 in which said arrays overlap one another.

4. A sensor according to claim 1 in which said arrays completely overlie each other while being spaced apart by a predetermined distance.

5. A sensor according to claim 4 in which said predetermined distance is from 2 to 3 mils.

6. A sensor according to claim 1 in which said chamber is evacuated.

7. A sensor according to claim 1 in which said chamber contains a small quantity of helium gas essentially only.

8. A sensor according to claim 1 further including means for communicating with said chamber through an orifice in said bonding agent.

9. A sensor according to claim 8 in which said last mentioned means comprises a tube disposed in sealed relationship with said orifice thereby to provide means for exclusively communicating with said chamber.

10. A sensor according to claim 1 in which both of said first and second quartz members are relatively thin and resilient.

* * * * *